United States Patent
Hayashi et al.

(10) Patent No.: US 8,421,247 B2
(45) Date of Patent: Apr. 16, 2013

(54) CONNECTING MATERIAL HAVING METALLIC PARTICLES OF AN OXYGEN STATE RATIO AND SIZE AND SEMICONDUCTOR DEVICE HAVING THE CONNECTING MATERIAL

(75) Inventors: Hiroki Hayashi, Tsukuba (JP); Kaoru Konno, Tsukuba (JP); Ayako Taira, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 41 days.

(21) Appl. No.: 12/990,082

(22) PCT Filed: Apr. 28, 2009

(86) PCT No.: PCT/JP2009/058375
§ 371 (c)(1),
(2), (4) Date: Dec. 29, 2010

(87) PCT Pub. No.: WO2009/133897
PCT Pub. Date: Nov. 5, 2009

(65) Prior Publication Data
US 2011/0101543 A1    May 5, 2011

(30) Foreign Application Priority Data
Apr. 30, 2008   (JP) ................................. 2008-118418

(51) Int. Cl.
*H01L 23/488* (2006.01)
*B32B 5/16* (2006.01)
*C09K 5/00* (2006.01)
*C22C 5/06* (2006.01)

(52) U.S. Cl.
USPC ...... 257/782; 257/E23.023; 252/74; 420/501; 428/402

(58) Field of Classification Search .................. 257/782, 257/E23.023; 252/74; 420/501; 428/402
See application file for complete search history.

(56) References Cited

U.S. PATENT DOCUMENTS 5,939,824 A * 8/1999 Kishi et al. ..................... 313/495
7,803,734 B2 * 9/2010 Majima et al. ................ 502/319

(Continued)

FOREIGN PATENT DOCUMENTS

CN          1737072      2/2006
CN        101055859     10/2007

(Continued)

OTHER PUBLICATIONS

Translation of the International Preliminary Report on Patentability dated Dec. 23, 2010, for International Application No. PCT/JP2009/058375.

(Continued)

*Primary Examiner* — A O Williams
(74) *Attorney, Agent, or Firm* — Antonelli, Terry, Stout & Kraus, LLP.

(57) ABSTRACT

A connecting material that includes metallic particles with an oxygen state ratio of less than 15% as measured by X-ray photoelectron spectroscopy and a mean particle size between 0.1 μm and 50 μm; and especially a connecting material that includes metallic particles that have been subjected to treatment for removal of a surface oxide film and subjected to surface treatment with a surface protective material, so as to provide a connecting material having a high coefficient of thermal conductivity even when joined at a curing temperature of up to 200° C. without application of a load, and that has sufficient bonding strength even when the cured product has been heated at 260° C.; as well as a semiconductor device employing the connecting material to bond a semiconductor element to a support member.

12 Claims, 8 Drawing Sheets

U.S. PATENT DOCUMENTS

| | | | |
|---|---|---|---|
| 7,915,190 B2 * | 3/2011 | Majima et al. | 502/5 |
| 8,305,281 B2 * | 11/2012 | Suetsuna et al. | 343/787 |
| 2006/0183625 A1 * | 8/2006 | Miyahara | 501/98.4 |
| 2007/0072036 A1 * | 3/2007 | Berta et al. | 429/33 |
| 2007/0296089 A1 | 12/2007 | Thomas et al. | |
| 2008/0261049 A1 * | 10/2008 | Hayashi et al. | 428/418 |

FOREIGN PATENT DOCUMENTS

| | | |
|---|---|---|
| JP | 11-66953 | 3/1999 |
| JP | 2003-206469 | 7/2003 |
| JP | 2005-93996 | 4/2005 |
| JP | 2006-73811 | 3/2006 |
| JP | 2006-83377 | 3/2006 |
| JP | 2006-302834 | 11/2006 |
| WO | WO 2008/037559 | 4/2008 |

OTHER PUBLICATIONS

Chinese Official Action dated Feb. 13, 2012, for CN Application No. 200980115161.2.

Chinese Official Action dated Jan. 23, 2013, for CN Application No. 200980115161.2.

* cited by examiner

CONNECTING MATERIAL HAVING METALLIC PARTICLES OF AN OXYGEN STATE RATIO AND SIZE AND SEMICONDUCTOR DEVICE HAVING THE CONNECTING MATERIAL

TECHNICAL FIELD

The present invention relates to a connecting material with excellent thermal conductivity and adhesion, and to a semiconductor device employing it. More specifically, it relates to a connecting material suitable for adhesion of semiconductor elements such as IC, LSI or light emitting diodes (LED) onto boards such as lead frames, ceramic wiring boards, glass epoxy wiring boards and polyimide wiring boards, as well as a semiconductor device employing it.

BACKGROUND ART

Methods of bonding semiconductor elements and lead frames (supporting members) during production of semiconductor devices include methods wherein a filler such as silver powder is dispersed in a resin such as an epoxy-based resin or polyimide-based resin to form a paste (for example, silver paste), which is used as a bonding agent.

According to this method, a dispenser or a printer or stamping machine is used to coat the paste-like bonding agent on the die pad of a lead frame, and then the semiconductor element is subjected to die bonding and heat cured for bonding to produce a semiconductor device.

The semiconductor device is mounted by soldering on a circuit board after the exterior has been sealed with a sealing material for semiconductor packaging. Because recent mounting requires high density and high efficiency, solder mounting is accomplished primarily by surface mounting methods wherein the lead frame of a semiconductor device is directly soldered to a board.

Such surface mounting employs reflow soldering whereby the entire board is heated with infrared rays, and the package is heated to a high temperature of 200° C. or above. When moisture is present during this time inside the package, and especially in the adhesive layer, the moisture becomes gasified and surrounds the die pad and sealing material, resulting in generation of cracks (reflow cracks) in the package.

Such reflow cracks significantly reduce the reliability of the semiconductor device and thus constitute a serious problem and technical issue, and therefore bonding agents widely employed for bonding of semiconductor elements and semiconductor supporting members are required to have reliability, including bonding strength at high temperature.

Furthermore, with the increasing speeds and higher integration of semiconductor elements in recent years, demand has also risen for high heat dissipation properties to ensure the operating stability of semiconductor devices, in addition to the conventional requirements of reliability including bonding strength. That is, efforts to find solutions to these technical problems have led to demand for connecting materials with both high bonding strength and a high coefficient of thermal conductivity, for use as bonding agents for bonding of heat-dissipating members (lead frames) and semiconductor elements.

In addition, one proposed means for achieving higher heat dissipation than conductive adhesives, which utilize contact between conventional metallic particles, has been the use of conductive adhesives that employ metal nanoparticles with mean particle sizes of up to 0.1 µm, which have excellent sintering properties, or wherein metal fine particles are sintered at high temperatures of 200° C. or above. This prior art is described in Patent documents 1-5, for example.

The conventional method for ensuring a high coefficient of thermal conductivity of bonding agents involves high filling of silver particles with a high coefficient of thermal conductivity. It has also been attempted to increase heat conduction and ensure strength at room temperature by using low melting point metals to form heat conduction paths by metallic bonding and metallize adherends. Conductive adhesives employing metal nanoparticles are also being studied.

CITATION LIST

Patent Literature

[Patent document 1] Japanese Unexamined Patent Application Publication No. 2006-073811
[Patent document 2] Japanese Unexamined Patent Application Publication No. 2006-302834
[Patent document 3] Japanese Unexamined Patent Application Publication No. 2005-093996
[Patent document 4] Japanese Unexamined Patent Application Publication HEI No. 11-066953
[Patent document 5] Japanese Unexamined Patent Application Publication No. 2006-083377

SUMMARY OF INVENTION

Technical Problem

However, in conventional methods that involve high filling of silver particles with a high coefficient of thermal conductivity, it has been necessary to use very large amounts of silver particles for silver particle filling weights of at least 95 parts by weight, in order to ensure thermal conductivity of 20 W/m·K or greater, which is required for modern power ICs and LEDs.

When the silver particle filling weight is increased, stringiness occurs during dispensing due to increased viscosity, making it impossible to guarantee manageability, and when a large amount of solvent is added to help guarantee manageability, problems can result such as reduced bonding strength due to void generation or to residual solvent.

When a PKG such as a power IC or LED is mounted on a board in a method wherein a low melting point metal is used for formation of a heat conduction path by metallic bonding and metallization with the adherend, it is exposed to 260° C. in the reflow furnace, but depending on its thermal history the joint may undergo remelting, making it impossible to obtain connection reliability.

In methods using metal nanoparticles it is possible to avoid the problem of remelting of joints, but the cost is increased for production of the nanosize metallic particles, and a large amount of surface protective material is necessary to obtain dispersion stability for the metal nanoparticles, and application of a high temperature of at least 200° C. or a load becomes necessary for sintering of the metal nanoparticles.

It is therefore an object of the present invention to provide a connecting material that has a high coefficient of thermal conductivity even when joined at a curing temperature of no higher than 200° C. without application of a load, and that has sufficient bonding strength even when the cured product has been heated at 260° C., as well as a semiconductor device employing it.

Solution to Problem

In light of the problems described above, the invention provides a connecting material comprising metallic particles having an oxygen state ratio of less than 15% as measured by X-ray photoelectron spectroscopy. This connecting material has a high coefficient of thermal conductivity even when joined at a curing temperature of no higher than 200° C. without application of a load, and has sufficient bonding strength even when the cured product has been heated at 260° C., as well as a semiconductor device employing it.

The metallic particles are preferably metallic particles that have been subjected to treatment for removal of the oxide film on the surface and surface treatment with a surface protective material.

The mean particle size of the metallic particles is preferably between 0.1 μm and 50 μm, and they are preferably metallic particles sintered at no higher than 200° C.

The connecting material of the invention preferably further comprises a volatile component or binder component.

The invention further provides a connecting material comprising a binder (A), a filler (B) and an additive (C), wherein the filler (B) and additive (C) are combined in the same weight ratio as the weight ratio in the connecting material, and the coefficient of thermal conductivity of the compact obtained by hot molding is at least 40 W/mK. Such a connecting material has an excellent viscosity for manageability, and allows the coefficient of thermal conductivity to be improved while maintaining bonding strength.

The term "hot molding" refers to heat treatment at 180° C. for 1 hour after molding to the prescribed size, and the term "coefficient of thermal conductivity" is that measured by the method described in the examples.

The content of the additive (C) is preferably 1-100 parts by weight with respect to 100 parts by weight of the binder (A).

The invention still further provides a semiconductor device having a structure with a semiconductor element and a semiconductor element-mounting supporting member bonded together through a connecting material of the invention.

Advantageous Effects of Invention

According to the invention, it is possible to provide a connecting material that has a high coefficient of thermal conductivity even with bonding at a curing temperature of no higher than 200° C. without application of a load, and that has sufficient bonding strength even when the cured product has been heated at 260° C., as well as a semiconductor device employing it. Such a connecting material can be suitably used as a conductive connecting material, conductive adhesive or die bonding material.

DESCRIPTION OF EMBODIMENTS

The connecting material of the invention comprises metallic particles having an oxygen state ratio of less than 15% as measured by X-ray photoelectron spectroscopy.

The oxygen state ratio in the metallic particles is preferably less than 10% and even more preferably less than 5%.

The X-ray photoelectron spectroscopy analyzer used may be, for example, an S-Probe ESCA Model 2803 by Surface Science Instruments, and AlK α-rays may be used as the irradiated X-rays. The term "state ratio" is the concentration of a specific element in a measuring sample, and it is the value calculated using the relative sensitivity coefficient provided with the apparatus, based on the intensity of the element. The oxygen state ratio of the metallic particles measured by X-ray photoelectron spectroscopy is an index of the size of the oxide film on the metallic particle surfaces.

The metallic particles used may be any of the known types. For example, conductive powder of gold, platinum, silver, copper, nickel, palladium, iron, aluminum or the like may be used, and such metallic particles may be used alone or in combinations of two or more types. Silver and copper are particularly preferred from the viewpoint of cost, electrical conductivity and thermal conductivity.

The metallic particles preferably have mean particle sizes of between 0.1 μm and 50 μm. With particles of less than 0.1 μm the production cost will tend to be higher, while particles of greater than 50 μm tend to have large voids between particles and a low coefficient of thermal conductivity.

The metallic particles are preferably metallic particles that have been subjected to treatment for removal of the oxide film on the surface and surface treatment with a surface protective material.

While the reason for which the effect of the invention is obtained by using such metallic particles is not completely understood, the present inventors offer the following explanation based on the schematic views in FIGS. 1 to 6.

Figure 1:
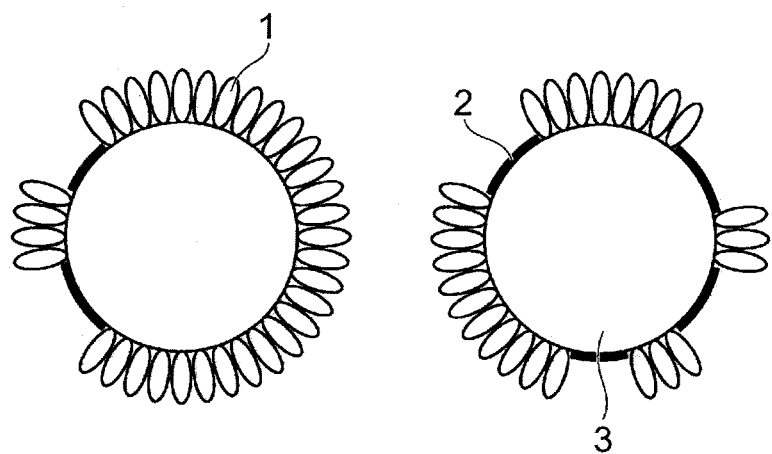
FIG. 1 is a schematic view of metallic particles that are metallic particles with a small oxide film on the surface, that have been surface treated with a surface protective material.

First, metallic particles with a small surface oxide film, that have been surface-treated with a surface protective material, presumably are in the condition shown in FIG. 1. That is, a minimal residual oxide film 2 is present on the bulk metal 3, while the surface protective material 1 covers the bulk metal 3 on sections other than the oxide film 2.

Figure 2:
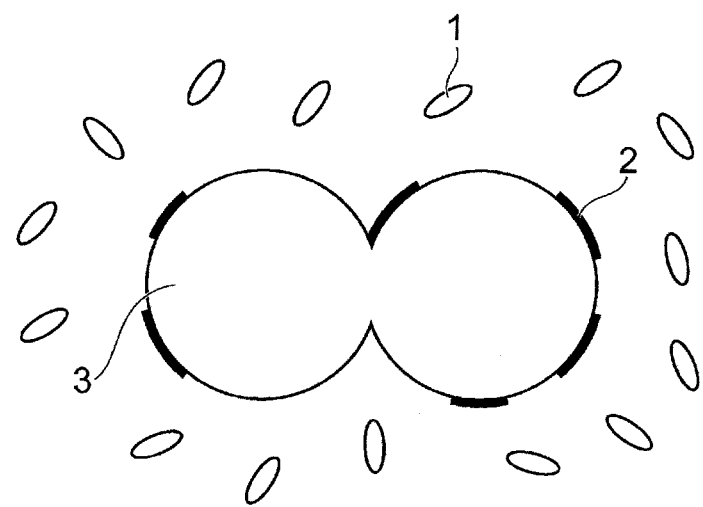
FIG. 2 is a schematic view showing the state of the metallic particles shown in FIG. 1, with the surface protective material detached and the metallic particles sintered together.

In this case, heating at no higher than 200° C. causes detachment of the surface protective material 1, resulting in exposure of the surface of the active bulk metal 3 as shown in FIG. 2, and the active surface contacts with the active surfaces of other metallic particles thus promoting sintering, and forming metal bonding paths between the metallic particles. The connecting material comprising such metallic particles presumably has a high coefficient of thermal conductivity even when heated no higher than 200° C.

Figure 3:
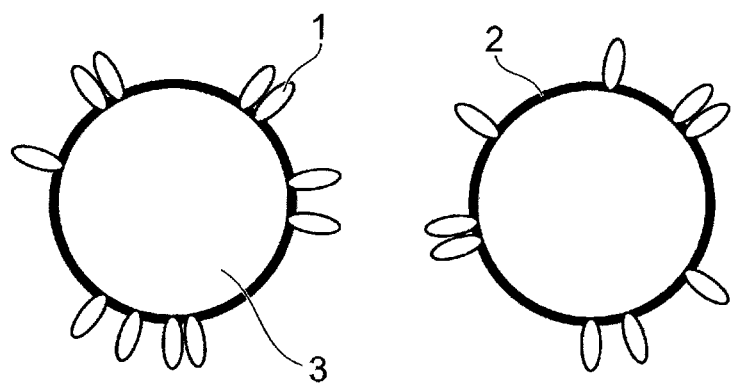
FIG. 3 is a schematic view of metallic particles that are metallic particles with a large oxide film on the surface, that have been surface treated with a surface protective material.
Figure 4:
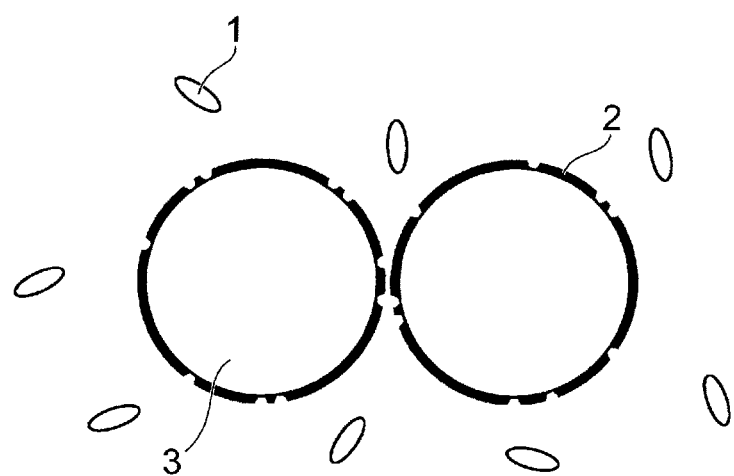
FIG. 4 is a schematic view showing the state of the metallic particles shown in FIG. 3, with the surface protective material detached but with the metallic particles unable to be sintered together.

On the other hand, in the case of metallic particles with a large oxide film 2 as shown in FIG. 3, heating at no higher than 200° C. causes detachment of the surface protective material 1 as shown in FIG. 4, but since the surfaces of the metallic particles are largely covered by the oxide film 2, sintering between the metallic particles does not easily occur.

Figure 5:
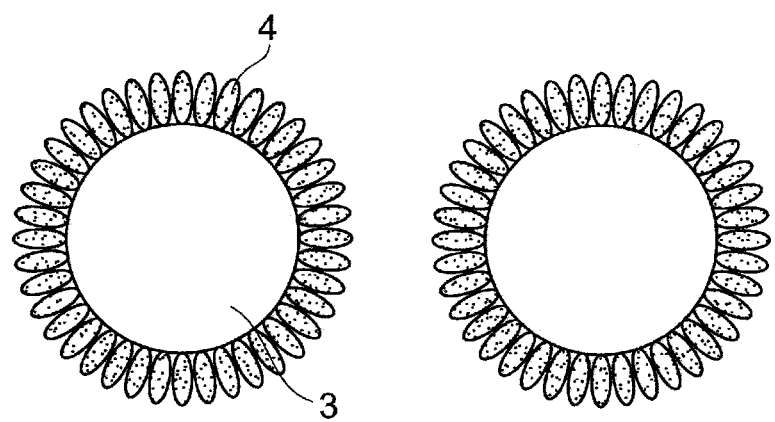
FIG. 5 is a schematic view of metallic particles that are metallic particles with a large oxide film, that have been treated for removal of the surface oxide film and surface treated with a surface protective material.
Figure 6:
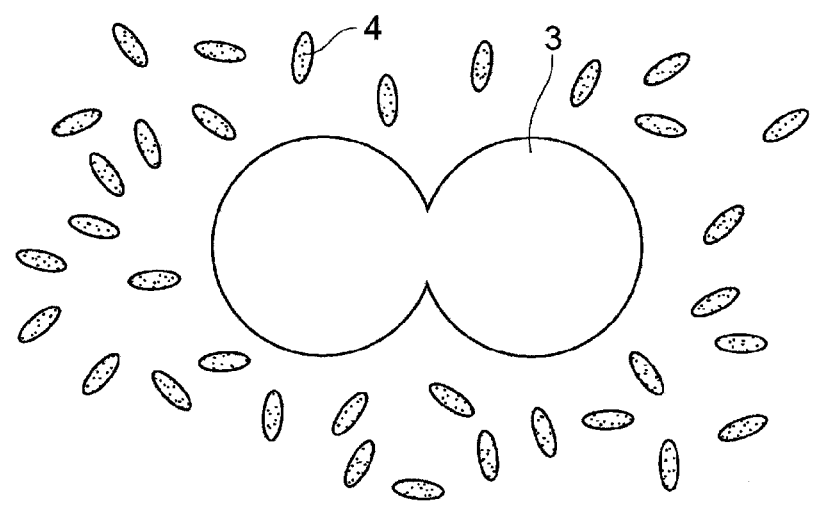
FIG. 6 is a schematic view showing the state of the metallic particles shown in FIG. 5, with the surface protective material detached and the metallic particles sintered together.

In contrast, even in the case of metallic particles with a large oxide film 2, that have been treated for removal of the surface oxide film 2 and have been surface-treated with a surface protective material, metallic particles wherein no oxide film 2 is present and the entire surface of the bulk metal 3 is covered by the surface protective material 4 as shown in FIG. 5 can be obtained.

In this case, heating at no higher than 200° C. causes detachment of the surface protective material 4, in the same manner as the metallic particles shown in FIG. 1, resulting in exposure of the surface of the active bulk metal 3, and the active surface contacts with the active surfaces of other metallic particles thus promoting sintering, and forming metal bonding paths between the metallic particles. During this time, the area of the exposed surface of the active bulk metal 3 is larger than that of the metallic particles of FIG. 1, and therefore presumably sintering is promoted to a greater extent, and an even higher coefficient of thermal conductivity is obtained.

The present inventors have also established a surface treatment method for metallic particles, whereby the amount of oxide film of the metallic particles is reduced or completely eliminated, and reoxidation and aggregation of the metallic particles is prevented. This method will now be described.

First, the metallic particles are added to an acidic solution in which the surface protective material is dissolved or dispersed, and the oxide film is removed while stirring, and surface protection is carried out.

Next, the solution is filtered to remove the metallic particles, and then the surface protective material or acid component physically adsorbed on the metallic particle surfaces is washed off with a solvent. The metallic particles are then dried under reduced pressure to remove the excess solvent, to obtain metallic particles surface-treated in a dry state.

When oxide film treatment has been performed in an acidic solution containing no surface protective material in the oxide film removal process, the metallic particles become aggregated, potentially making it impossible to obtain powder-like metallic particles having mean particle sizes equal to the particles before oxide film treatment. Preferably, a surface protective material is added to the acidic solution to prevent aggregation of the metallic particles, and the oxide film removal and surface treatment are carried out simultaneously.

There are no particular restrictions on the acidic solution, and the acid used may be sulfuric acid, nitric acid, hydrochloric acid, acetic acid, phosphoric acid or the like. The diluting solvent for the acid is also not restricted, but preferably it is a solvent with good compatibility with the acid and excellent solubility and dispersibility for the surface protective material.

For removal of the oxide film, the concentration of the acid in the acidic solution is preferably at least 1 part by weight with respect to 100 parts by weight as the entire acidic solution, and more preferably it is at least 5 parts by weight when metallic particles with a thick oxide film are included.

If the acid concentration is too high, an excessive amount of metal will dissolve in the solution, and it is therefore preferably no greater than 50 parts by weight and more preferably no greater than 40 parts by weight to prevent aggregation between the particles.

The surface protective material is preferably a compound having terminal functional groups with satisfactory adsorption onto the metal surface. Examples include compounds with hydroxyl, carboxyl, amino, thiol and disulfide groups, and compounds with thiol groups are preferred. Using such a surface protective material can prevent reoxidation and particle aggregation.

In order to more fully prevent reoxidation of the metallic particles and adsorption contamination of excess organic material, the main backbone of the compound is preferably one having a straight-chain alkane backbone, allowing dense packing of the protective material.

The alkane backbone more preferably has 4 or more carbon atoms, for dense packing by the intermolecular force between carbon chains.

For sintering of the metallic particles at a low temperature of no higher than 200° C., the number of carbon atoms is preferably no greater than 18 so that the detachment temperature from the metal surface of the surface protective material is below 200° C.

Examples of compounds having thiol groups and having a straight-chain alkane backbone as the main backbone include ethyl, n-propyl, i-propyl, n-butyl, i-butyl, t-butyl, pentyl and hexyl, which have 1-18 carbon atoms, or mercaptans or cycloalkylmercaptans such as dodecylmercaptan and stearylmercaptans including mercaptans with 5-7 carbon atoms, such as cyclopentyl, cyclohexyl or cycloheptylmercaptanes.

The concentration of the surface protective material in the acidic solution is preferably at least 0.0001 part by weight with respect to 100 parts by weight as the entire acidic solution, to prevent aggregation between metallic particles, and it is preferably no greater than 0.1 part by weight to prevent excessive physical adsorption of the surface protective material onto the metallic particles.

The proportion of the metallic particles in the connecting material is preferably at least 80 parts by weight, with respect to 100 parts by weight as the entire connecting material, for an increased coefficient of thermal conductivity, and more preferably at least 87 parts by weight in order to obtain a coefficient of thermal conductivity equal to or greater than that of high-temperature solder.

For a paste-like connecting material, the proportion of metallic particles is preferably no greater than 99 parts by weight with respect to 100 parts by weight as the entire connecting material, and more preferably no greater than 95 parts by weight for improved manageability in the dispenser or printer.

The volatile component used for the invention is not particularly restricted so long as the metallic particles become sintered when the mixture with the metallic particles has been subjected to a prescribed thermal history.

Examples of volatile components include ethyleneglycol butyl ether, ethyleneglycol phenyl ether, diethyleneglycol methyl ether, diethyleneglycol ethyl ether, diethyleneglycol butyl ether, diethyleneglycol isobutyl ether, diethyleneglycol hexyl ether, triethyleneglycol methyl ether, diethyleneglycol dimethyl ether, diethyleneglycol diethyl ether, diethyleneglycol dibutyl ether, diethyleneglycol butyl methyl ether, diethyleneglycol isopropyl methyl ether, triethyleneglycol dimethyl ether, triethyleneglycol butyl methyl ether, ethyleneglycol ethyl ether acetate, ethyleneglycol butyl ether acetate, diethyleneglycol ethyl ether acetate, diethyleneglycol butyl ether acetate, propyleneglycol propyl ether, dipropyleneglycol methyl ether, dipropyleneglycol ethyl ether, dipropyleneglycol propyl ether, dipropyleneglycol butyl ether, dipropyleneglycol dimethyl ether, tripropyleneglycol methyl ether, tripropyleneglycol dimethyl ether, dipropyleneglycol methyl ether acetate, 3-methyl-3-methoxybutanol, ethyl lactate, butyl lactate, γ-butyrolactone, α-terpineol, isophorone, p-cymene, 1,3-dimethyl-2-imidazolidinone, anisole, dimethyl sulfoxide, hexamethylphosphorylamide, m-cresol, o-chlorphenol, cellosolve acetate, N-methyl-2-pyrrolidone, N,N-dimethylacetamide, N,N-dimethylformamide, sulfolane, tetrahydrofuran, dioxane, monoglyme, diglyme, benzene, toluene, xylene, methyl ethyl ketone, methylcellosolve, cellosolve acetate, cyclohexanone and the like.

These volatile components may be used alone or as mixtures of two or more components as necessary. For increased thermal conductivity, the content of volatile components is preferably no greater than 20 parts by weight with respect to 100 parts by weight as the entire connecting material.

The binder component (binder (A)) used for the invention contains an organic polymer compound or its precursor, and if necessary one or more components such as a reactive diluent, a curing agent, a curing accelerator to improve the curing property, a plasticizer for stress relaxation, a diluent for improved manageability, an adhesive force improver, a wettability improver, an antifoaming agent or a reactive diluent to lower the viscosity. There is no problem if the connecting material of the invention also contains components other those listed here.

The organic polymer compound or its precursor is not particularly restricted, and thermosetting resins or their precursors are preferred, for example. Examples of such resins include epoxy resins, acrylic resins, maleimide resins, cyanate resins, and their precursors.

Of these, compounds with polymerizable ethylenic carbon-carbon double bonds such as acrylic resins and maleimide resins, or epoxy resins, are preferred for excellent heat resistance and adhesion, and for superior manageability since they can be used in liquid form by using appropriate solvents. These resins may be used alone or in combinations of two or more.

When an epoxy resin is used as the thermosetting resin, it is preferred to also use a curing agent and curing accelerator. The epoxy resin is preferably a compound with at least two epoxy groups in the molecule, and examples include epoxy resins derived from bisphenol A, bisphenol F, bisphenol AD and the like, and epichlorhydrin.

Such compounds are not particularly restricted so long as they are compounds with two or more epoxy groups in the molecule, and examples include bisphenol A-type epoxy resins [AER-X8501 (trade name of Asahi Kasei Corp.), R-301 (trade name of Yuka-Shell Epoxy Co., Ltd.) and YL-980 (trade name of Yuka-Shell Epoxy Co., Ltd.)], bisphenol F-type epoxy resins [YDF-170 (trade name of Tohto Kasei Co., Ltd.)], bisphenol AD-type epoxy resins [R-1710 (trade name of Mitsui Petroleum Chemical Co., Ltd.)], phenol-novolac-type epoxy resins [N-730S (trade name of Dainippon Ink and Chemicals, Inc.) and Quatrex-2010 (trade name of Dow Chemical Corp.)], cresol-novolac-type epoxy resins [YDCN-702S (trade name of Tohto Kasei Co., Ltd.) and EOCN-100 (trade name of Nippon Kayaku Co., Ltd.)], polyfunctional epoxy resins [EPPN-501 (trade name of Nippon Kayaku Co., Ltd.), TACTIX-742 (trade name of Dow Chemical Corp.), VG-3010 (trade name of Mitsui Petroleum Chemical Co., Ltd.) and 1032S (trade name of Yuka-Shell Epoxy Co., Ltd.)], epoxy resins with naphthalene backbones [HP-4032 (trade name of Dainippon Ink and Chemicals, Inc.)], alicyclic epoxy resins [EHPE-3150, CEL-3000 (trade name of Daicel Chemical Industries, Ltd.) and DME-100 (trade name of New Japan Chemical Co., Ltd.)], aliphatic epoxy resins [W-100 (trade name of New Japan Chemical Co., Ltd.)], amine-type epoxy resins [ELM-100 (trade name of Sumitomo Chemical Co., Ltd.), YH-434L (trade name of Tohto Kasei Co., Ltd.), TETRAD-X and TETRAC-C (trade names of Mitsubishi Gas & Chemical Co., Inc.)], resorcin-type epoxy resins [DENACOL EX-201 (trade name of Nagase Chemicals, Ltd.)], neopentyl glycol-type epoxy resins [DENACOL EX-211 (trade name of Nagase Chemicals, Ltd.)], hexanedienyl glycol-type epoxy resins [DENACOL EX-212 (trade name of Nagase Chemicals, Ltd.)], ethylene/propylene glycol-type epoxy resins [DENACOL EX-810, 811, 850, 851, 821, 830, 832, 841 and 861 (trade names of Nagase Chemicals, Ltd.)], and epoxy resins represented by the following formula (I):

[Chemical Formula 1]

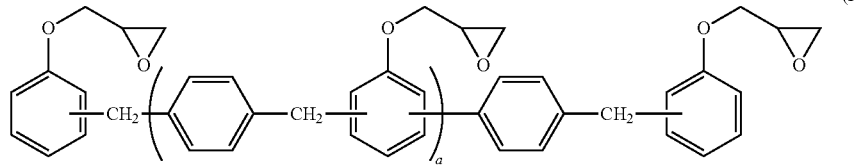

(I)

(wherein "a" represents an integer of 0-5), [E-XL-24 and E-XL-3L (trade names of Mitsui Chemicals, Inc.)]. These epoxy resins may also be used in appropriate combinations.

The epoxy resin may also include an epoxy compound having only one epoxy group in the molecule (reactive diluent). Such an epoxy compound may be used in a range that does not inhibit the properties of the connecting material of the invention, and preferably in a range of 0-30 wt % with respect to the total epoxy resin.

Commercially available examples of such epoxy compounds include PGE (trade name of Nippon Kayaku Co., Ltd.), PP-101 (trade name of Tohto Kasei Co., Ltd.), ED-502, 509 and 509S (trade names of Adeka Corp.), YED-122 (trade name of Yuka-Shell Epoxy Co., Ltd.), KBM-403(trade name of Shin-Etsu Chemical Co., Ltd.) and TSL-8350, TSL-8355 and TSL-9905 (trade names of Toshiba Silicone).

There are no particular restrictions on epoxy resin curing agents, and examples include phenol-novolac resins [H-1, trade name of Meiwa Plastic Industries, Ltd.), VR-9300 (trade name of Mitsui Chemicals, Inc.), phenolaralkyl resins [XL-225 (trade name of Mitsui Chemicals, Inc.)], allylated phenol-novolac resins [AL-VR-9300 (trade name of Mitsui Chemicals, Inc.)], special phenol resins represented by the following formula (II):

[Chemical Formula 2]

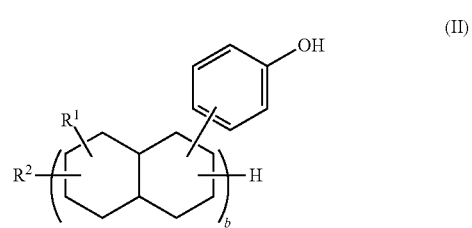

(II)

(wherein $R^1$ represents a C1-6 alkyl group such as methyl or ethyl, $R^2$ represents hydrogen or a C1-6 alkyl group such as methyl or ethyl, and b represents an integer of 2-4) [PP-700-300 (trade name of Nippon Petrochemicals Co., Ltd.), bisphenol F, A, AD, allylated bisphenol F, A, AD, dicyandiamides, dibasic acid dihydrazides represented by the following formula (III):

[Chemical Formula 3]

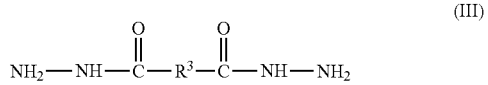

(wherein $R^3$ represents a divalent aromatic hydrocarbon such as m-phenylene or p-phenylene, or a C2-12 straight-chain or branched-chain alkylene group) [ADH, PDH or SDH (all trade names of Japan Hydrazine Co., Inc.)], and microencapsulated curing agents composed of reaction products of epoxy resins and amine compounds [NOVACURE (trade name of Asahi Kasei Corp.)]. These curing agents may also be used in appropriate combinations.

The content of the epoxy resin curing agent is preferably 0.01-90 parts by weight and more preferably 0.1-50 parts by weight with respect to 100 parts by weight of the epoxy resin. If the epoxy resin curing agent content is less than 0.01 part by weight the curability will tend to be reduced, and if it is greater than 90 parts by weight the viscosity will increase, tending to lower the manageability.

The connecting material of the invention may also contain an added curing accelerator, if necessary. Curing accelerators include organic boron salt compounds [EMZ/K, TPPK (trade names of Hokko Chemical Industry Co., Ltd.)], tertiary amines or their salts [DBU, U-CAT102, 106, 830, 840 and 5002 (trade names of San-Apro Ltd.)] and imidazoles [CUREZOL, 2P4 MHZ, C17Z and 2PZ-OK (trade names of Shikoku Chemicals Corp.)].

The epoxy resin curing agent and the curing accelerator added as necessary may be used alone, or several epoxy resin curing agents and curing accelerators may be used in combination. The curing accelerator content is preferably no greater than 20 parts by weight with respect to 100 parts by weight of the epoxy resin.

Compounds with polymerizable ethylenic carbon-carbon double bonds to be used for the invention include acrylic acid ester compounds and methacrylic acid ester compounds, and there may be used compounds having one or more acrylic groups or methacrylic groups in the molecule, and preferably compounds represented by the following formulas (IV)-(XIII).

Compounds represented by formula (IV):

[Chemical Formula 4]

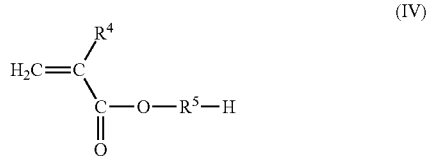

(wherein $R^4$ represents hydrogen or a methyl group, and $R^5$ represents a CI-100 and preferably C1-36 divalent aliphatic or aliphatic hydrocarbon group with a cyclic structure).

Compounds represented by formula (IV) include acrylate compounds such as methyl acrylate, ethyl acrylate, propyl acrylate, isopropyl acrylate, n-butyl acrylate, isobutyl acrylate, t-butyl acrylate, amyl acrylate, isoamyl acrylate, hexyl acrylate, heptyl acrylate, octyl acrylate, 2-ethylhexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, isobornyl acrylate and tricyclo[$5.2.1.0^{2,6}$]decyl acrylate, and methacrylate compounds such as methyl methacrylate, ethyl methacrylate, propyl methacrylate, isopropyl methacrylate, n-butyl methacrylate, isobutyl methacrylate, t-butyl methacrylate, amyl methacrylate, isoamyl methacrylate, hexyl methacrylate, heptyl methacrylate, octyl methacrylate, 2-ethylhexyl methacrylate, nonyl methacrylate, decyl methacrylate, isodecyl methacrylate, lauryl methacrylate, tridecyl methacrylate, hexadecyl methacrylate, stearyl methacrylate, isostearyl methacrylate, cyclohexyl methacrylate, isobornyl methacrylate and tricyclo[$5.2.1.0^{2,6}$]decyl methacrylate.

Compounds represented by formula (V):

[Chemical Formula 5]

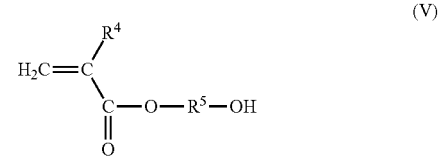

(wherein $R^4$ and $R^5$ represent the same groups as in formula (IV)).

Compounds represented by formula (V) include 2-hydroxyethyl acrylate, 2-hydroxypropyl acrylate, 2-hydroxyethyl methacrylate and 2-hydroxypropyl methacrylate.

Compounds represented by formula (VI):

[Chemical Formula 6]

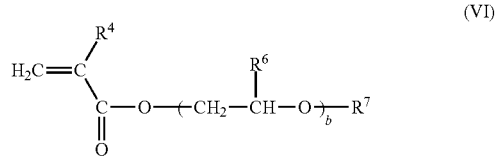

(wherein $R^4$ represents the same group as in formula (IV), $R^6$ represents hydrogen, methyl or phenoxymethyl, $R^7$ represents hydrogen, C1-6 alkyl, dicyclopentenyl, phenyl or benzoyl, and b represents an integer of 1-50).

Compounds represented by formula (VI) include acrylate compounds such as diethyleneglycol acrylate, polyethyleneglycol acrylate, polypropyleneglycol acrylate, 2-methoxyethyl acrylate, 2-ethoxyethyl acrylate, 2-butoxyethyl acrylate, methoxydiethyleneglycol acrylate, methoxypolyethyleneglycol acrylate, dicyclopentenyloxyethyl acrylate, 2-phenoxyethyl acrylate, phenoxydiethyleneglycol acrylate, phenoxypolyethyleneglycol acrylate, 2-benzoyloxyethyl acrylate and 2-hydroxy-3-phenoxypropyl acrylate, and methacrylate compounds such as diethyleneglycol methacrylate, polyethyleneglycol methacrylate, polypropyleneglycol methacrylate, 2-methoxyethyl methacrylate, 2-ethoxyethyl methacrylate, 2-butoxyethyl methacrylate, methoxydiethyleneglycol methacrylate, methoxypolyethyleneglycol methacrylate, dicyclopentenyloxyethyl methacrylate, 2-phenoxyethyl methacrylate, phenoxydiethyleneglycol methacrylate, phenoxypolyethyleneglycol methacrylate, 2-benzoyloxyethyl methacrylate and 2-hydroxy-3-phenoxypropyl methacrylate.

Compounds represented by formula (VII):

[Chemical Formula 7]

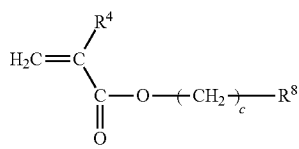

(VII)

[wherein $R^4$ represents the same group as in formula (IV), $R^8$ represents phenyl, nitrile, —Si(OR$^9$)$_3$ (where $R^9$ represents a C1-6 alkyl group), or

[Chemical Formula 8]

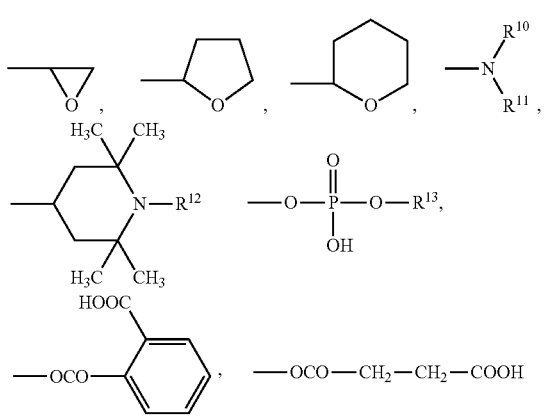

(VII')

(wherein $R^{10}$, $R^{11}$ and $R^{12}$ each independently represent hydrogen or a C1-6 alkyl group, and $R^{13}$ represents hydrogen or a C1-6 alkyl or phenyl group), and c represents a number of 0, 1, 2 or 3].

Compounds represented by formula (VII) and (VII') include acrylate compounds such as benzyl acrylate, 2-cyanoethyl acrylate, γ-acryloyloxypropyltrimethoxysilane, glycidyl acrylate, tetrahydrofurfuryl acrylate, tetrahydropyranyl acrylate, dimethylaminoethyl acrylate, diethylaminoethyl acrylate, 1,2,2,6,6,-pentamethylpiperidinyl acrylate, 2,2,6,6,-tetramethylpiperidinyl acrylate, acryloyloxyethyl phosphate, acryloyloxyethylphenyl acid phosphate, β-acryloyloxyethylhydrogen phthalate and β-acryloyloxyethylhydrogen succinate, methacrylates such as benzyl methacrylate, 2-cyanoethyl methacrylate, γ-methacryloyloxypropyltrimethoxysilane, glycidyl methacrylate, tetrahydrofurfuryl methacrylate, tetrahydropyranyl methacrylate, dimethylaminoethyl methacrylate, diethylaminoethyl methacrylate, 1,2,2,6,6,-pentamethylpiperidinyl methacrylate, 2,2,6,6,-tetramethylpiperidinyl methacrylate, methacryloyloxyethyl phosphate and methacryloyloxyethylphenyl acid phosphate, and methacrylate compounds such as β-methacryloyloxyethylhydrogen phthalate and β-methacryloyloxyethylhydrogen succinate.

Compounds represented by formula (VIII):

[Chemical Formula 9]

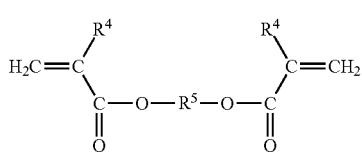

(VIII)

(wherein $R^4$ and $R^5$ represent the same groups as in formula (IV)).

Compounds represented by formula (VIII) include diacrylate compounds such as ethyleneglycol diacrylate, 1,4-butanediol diacrylate, 1,6-hexanediol diacrylate, 1,9-nonanediol diacrylate, 1,3-butanediol diacrylate, neopentyl glycol diacrylate and dimer diol diacrylates, and dimethacrylate compounds such as ethyleneglycol dimethacrylate, 1,4-butanediol dimethacrylate, 1,6-hexanediol dimethacrylate, 1,9-nonanediol dimethacrylate, 1,3-butanediol dimethacrylate, neopentyl glycol dimethacrylate and dimer diol dimethacrylates.

Compounds represented by formula (IX):

[Chemical Formula 10]

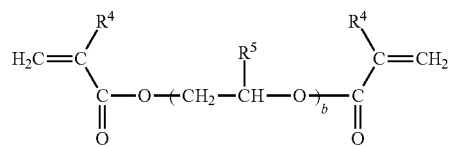

(IX)

(wherein $R^4$ represents the same group as in formula (IV), and $R^6$ and b represent the same groups as in formula (VI)).

Compounds represented by formula (IX) include diacrylate compounds such as diethyleneglycol diacrylate, triethyleneglycol diacrylate, tetraethyleneglycol diacrylate, polyethyleneglycol diacrylate, tripropyleneglycol diacrylate and polypropyleneglycol diacrylate, and dimethacrylate compounds such as diethyleneglycol dimethacrylate, triethyleneglycol dimethacrylate, tetraethyleneglycol dimethacrylate, polyethyleneglycol dimethacrylate, tripropyleneglycol dimethacrylate and polypropyleneglycol dimethacrylate.

Compounds represented by formula (X):

[Chemical Formula 11]

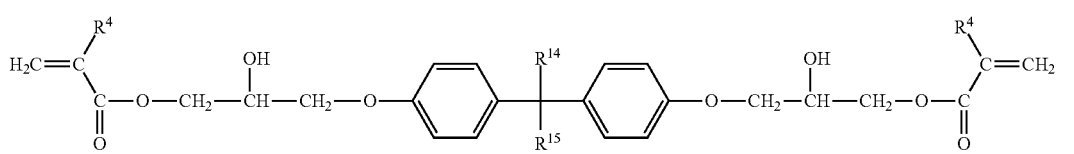

(X)

(wherein $R^4$ represents the same group as in formula (IV), and $R^{14}$ and $R^{15}$ each independently represents hydrogen or a methyl group).

Compounds represented by formula (X) include reaction products of 1 mole of bisphenol A, bisphenol F or bisphenol AD and 2 moles of glycidyl acrylate, and reaction products of 1 mole of bisphenol A, bisphenol F or bisphenol AD and 2 moles of glycidyl methacrylate.

Compounds represented by formula (XI):

[Chemical Formula 12]

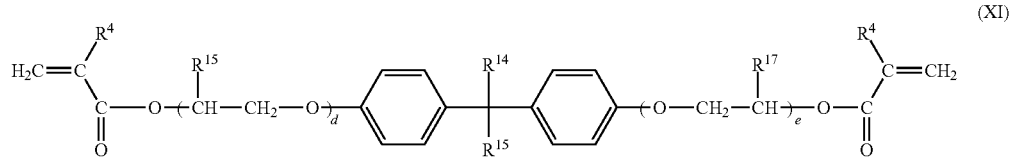

(XI)

(wherein $R^4$ represents the same group as in formula (IV), $R^{14}$ and $R^{15}$ represent the same groups as in formula (X), $R^{16}$ and $R^{17}$ each independently represent hydrogen or a methyl group, and d and e each independently represent an integer of 1-20).

Compounds represented by formula (XI) include diacrylates of polyethylene oxide addition products of bisphenol A, bisphenol F or bisphenol AD, diacrylates of polypropylene oxide addition products of bisphenol A, bisphenol F or bisphenol AD, dimethacrylates of polyethylene oxide addition products of bisphenol A, bisphenol F or bisphenol AD, and dimethacrylates of polypropylene oxide addition products of bisphenol A, bisphenol F or bisphenol AD.

Compounds represented by formula (XII):

[Chemical Formula 13]

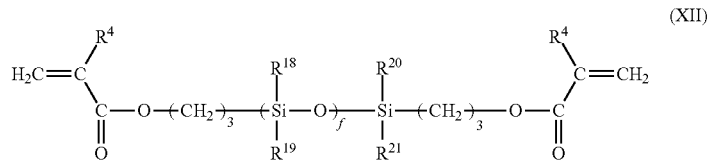

(XII)

(wherein $R^4$ represents the same group as in formula (IV), $R^{18}$, $R^{19}$, $R^{20}$ and $R^{21}$ each independently represent hydrogen or a methyl group, and f represents an integer of 1-20).

Compounds represented by formula (XII) include bis(acryloyloxypropyl)polydimethylsiloxane, bis(acryloyloxypropyl)methylsiloxane-dimethylsiloxane copolymer, bis(methacryloyloxypropyl)polydimethylsiloxane and bis(methacryloyloxypropyl)methylsiloxane-dimethylsiloxane copolymer.

Compounds represented by formula (XIII):

[Chemical Formula 14]

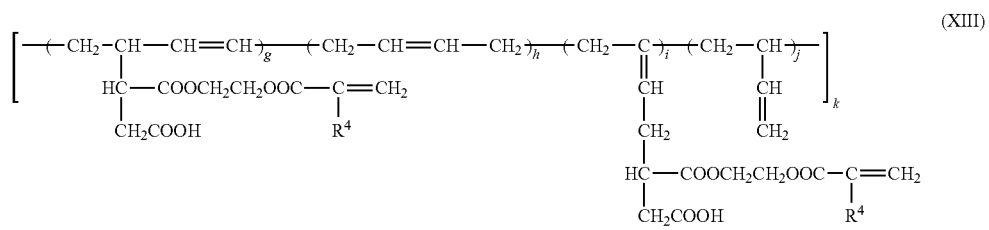

(XIII)

(wherein R⁴ represents the same group as in formula (IV), and g, h, i, j and k each independently represent integers of 1 or greater and preferably 1-10).

Compounds represented by formula (XIII) include reaction products obtained by reacting a polybutadiene added to maleic anhydride, with an acrylic acid ester compound or methacrylic acid ester compound having a hydroxyl group in the molecule, as well as their hydrogenated forms, and they are not particularly restricted so long as they have at least one acrylic group or methacrylic group in the molecule, and may be MM-1000-80 or MAC-1000-80 (both trade names of Nippon Petrochemicals Co., Ltd.), for example.

Compounds having polymerizable ethylenic carbon-carbon double bonds may be any of the aforementioned compounds alone or in combinations of two or more.

When a compound having an ethylenic carbon-carbon double bond is used as the thermosetting resin, it is preferred to use a radical initiator with it as a curing agent catalyst. There are no particular restrictions on the radical initiator, although a peroxide is preferred from the viewpoint of voids and the like, and from the viewpoint of connecting material curability and viscosity stability, the decomposition temperature of the peroxide is preferably 70-170° C.

Specific examples of radical initiators include 1,1,3,3-tetramethylperoxy-2-ethyl hexanoate, 1,1-bis(t-butylperoxy)cyclohexane, 1,1-bis(t-butylperoxy)cyclododecane, di-t-butylperoxy isophthalate, t-butyl perbenzoate, dicumyl peroxide, t-butylcumyl peroxide, 2,5-dimethyl-2,5-di(t-butylperoxy)hexane, 2,5-dimethyl-2,5-di(t-butylperoxy)hexyne and cumene hydroperoxide.

The radical initiator content is preferably 0.1-10 parts by weight and most preferably 0.5-5 parts by weight, with respect to 100 parts by weight as the total weight of the compound with a polymerizable ethylenic carbon-carbon double bond.

These binder components may be used alone or as mixtures of two or more components as necessary. The binder component content is preferably no greater than 3-30 parts by weight with respect to 100 parts by weight as the entire connecting material.

Examples of plasticizers include acrylonitrile-butadiene copolymers such as liquid polybutadiene ("CTBN-1300×31" and "CTBN-1300×9" by Ube Industries, Ltd.), and preferably they have one or more functional groups, selected from among epoxy, carboxyl, amino and vinyl groups, in the molecule.

An acrylonitrile-butadiene copolymer can be reacted beforehand with the aforementioned epoxy resin in a proportion of epoxy resin: acrylonitrile-butadiene copolymer=10:90-90:10 (by weight), at 80° C.-120° C. for a period of about 20 minutes-6 hours. During the reaction, a relatively high boiling point organic solvent such as butylcellosolve, carbitol, butylcellosolve acetate, carbitol acetate, ethyleneglycol diethyl ether or α-terpineol may be used if necessary.

The number-average molecular weight of the acrylonitrile-butadiene copolymer is preferably 500-10,000. A molecular weight of less than 500 will tend to result in inferior chip warping-reducing effect, while a molecular weight of greater than 10,000 will tend to result in increased viscosity and inferior manageability of the connecting material. The number-average molecular weight is the value measured by vapor pressure osmosis, or the value measured by gel permeation chromatography utilizing a calibration curve for standard polystyrene (hereunder referred to as "GPC").

An epoxidated polybutadiene is preferably one with 100-500 (g/eq) epoxy equivalents. With less than 100 epoxy equivalents, the viscosity will tend to increase and the manageability of the connecting material will tend to be lowered, while greater than 500 will tend to lower the hot bonding strength. The epoxy equivalent value is that determined by the perchloric acid method. The epoxidated polybutadiene may also be one having a hydroxyl group in the molecule.

The number-average molecular weight of the epoxidated polybutadiene is preferably 500-10,000. A molecular weight of less than 500 will tend to result in an inferior chip warping-reducing effect, while a molecular weight of greater than 10,000 will tend to result in increased viscosity and inferior manageability of the connecting material. The number-average molecular weight is the value measured by GPC.

The plasticizer has an effect of relieving stress generated by adhesion between the semiconductor element and lead frame. In most cases, the plasticizer is added at 0-500 parts by weight, where 100 parts by weight is the total of the organic polymer compound and its precursor.

The connecting material of the invention may also contain, as necessary, humectants such as calcium oxide or magnesium oxide, adhesive force improvers such as silane coupling agents, titanate coupling agents, aluminum coupling agents and zircoaluminate coupling agents, wetting improvers such as nonionic surfactants and fluorine-based surfactants, antifoaming agents such as silicone oils, ion trapping agents such as inorganic ion exchangers, and polymerization inhibitors, added as appropriate.

Examples of silane coupling agents include vinyltris(β-methoxyethoxy)silane, vinyltriethoxysilane, vinyltrimethoxysilane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldiethoxysilane, N-phenyl-γ-aminopropyltrimethoxysilane, γ-mercaptopropyltrimethoxysilane, hexamethyldisilazane, N,O-(bistrimethylsilyl)acetamide, N-methyl-3-aminopropyltrimethoxysilane, 4,5-dihydroimidazolepropyltriethoxysilane, γ-mercaptopropyltriethoxysilane, γ-mercaptopropylmethyldimethoxysilane, 3-cyanopropyltrimethoxysilane, methyltri(methacryloyloxyethoxy)silane, methyltri(glycidyloxy)silane, 2-ethylhexyl-2-ethylhexyl phosphonate, γ-glycidoxypropylmethyldimethoxysilane, vinyltriacetoxysilane, γ-anilinopropyltrimethoxysilane, γ-mercaptopropylmethyldimethoxysilane, γ-methacryloxypropylmethyldimethoxysilane, N-trimethylsilylacetamide, dimethyltrimethylsilylamine, diethyltrimethylsilylamine, trimethylsilylimidazole, trimethylsilyl isocyanate, dimethylsilyl diisocyanate, methylsilyl triisocyanate, vinylsilyl triisocyanate, phenylsilyl triisocyanate, tetraisocyanatesilane and ethoxysilane triisocyanate.

Examples of titanate coupling agents include isopropyltriisostearoyl titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate)titanate, isopropyltricumylphenyl titanate, isopropyltris(dioctyl pyrophosphate) titanate, tetraisopropylbis(dioctyl phosphite)titanate, tetraoctylbis(ditridecyl phosphite)titanate, tetra(2,2-diallyloxymethyl-1-butyl)bis(ditridecyl)phosphite titanate, dicumylphenyloxy acetate titanate, bis(dioctylpyrophosphato)oxyacetate titanate, diisostearoylethylene titanate, bis(dioctyl pyrophosphate)ethylene titanate, diisopropoxybis(2,4-pentadionato)titanium(IV), diisopropylbistriethanolamino titanate, titanium lactate, acetoacetic ester titanate, di-1-propoxybis(acetylacetonato)titanium, di-n-butoxybis(triethanolaminato)titanium, dihydroxybis(lactato)titanium, titanium- 1-propoxyoctyleneglycolate, titanium stearate, tri-n-butoxytitanium monostearate, titanium lactate ethyl ester, titanium triethanolaminate.

Examples of polymerization inhibitors include quinones, hydroquinone, nitro/nitroso compounds, amines, polyoxy compounds, p-tert-butylcatechol, picric acid, sulfur-containing compounds such as dithiobenzoyl disulfide, cupric chloride, diphenylpicrylhydrazyl, tri-p-nitrophenylmethyl, triphenylverdazyl, N-(3-N-oxyanilino-1,3-dimethylbutylidene) aniline oxide and the like, with no limitation to these.

The connecting material of the invention may also contain an added bleed inhibitor, if necessary. Examples of bleed inhibitors include fatty acids such as perfluorooctanoic acid, octanoic acid amide and oleic acid, and perfluorooctylethyl acrylate, silicone and the like.

The filler (B) used may be a known one, for example, a conductive powder such as gold, platinum, silver, copper, nickel, palladium, iron or aluminum. These fillers may be used alone or in combinations of two or more. Silver and copper are particularly preferred from the viewpoint of cost, electrical conductivity and thermal conductivity.

The aforementioned volatile component or surface protective agent may be used as the additive (C).

For production of the connecting material, the metallic particles, volatile component, binder, with a diluent added as necessary, are prepared as a homogeneous paste by, heating, mixing, dissolving, decoagulation kneading or dispersion, as necessary, using an appropriate combination of dispersing/dissolving apparatuses such as a stirrer, kneader, triple roll, planetary mixer or the like.

Figure 7:
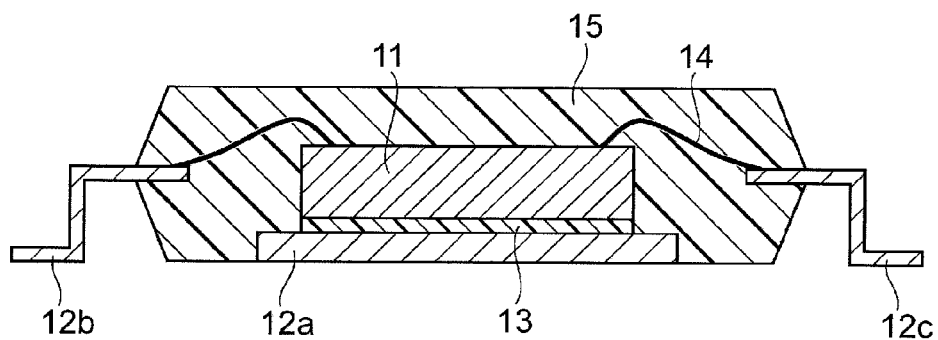
FIG. 7 is a schematic cross-sectional view showing an example of a semiconductor device according to the invention.

FIG. 7 is a schematic cross-sectional view showing an example of a semiconductor device produced using a connecting material of the invention. The semiconductor device in FIG. 7 comprises three lead frames (radiators) 12a, 12b, 12c, a chip (heating unit) 11 connected onto the lead frame 12a via a connecting material of the invention, and a mold resin 15 that molds them. The chip 11 is connected to the lead frames 12b, 12c by two wires 14.

Figure 8:
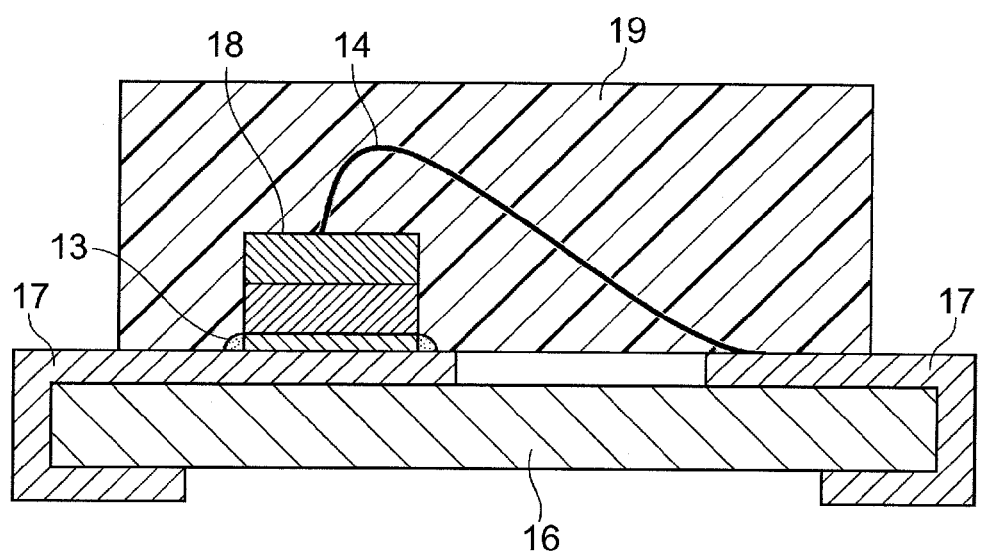
FIG. 8 is a schematic cross-sectional view showing another example of a semiconductor device according to the invention.

FIG. 8 is a schematic cross-sectional view showing another example of a semiconductor device produced using a connecting material of the invention. The semiconductor device shown in FIG. 7 comprises a board 16, two lead frames 17 formed surrounding the board, a LED chip 18 connected on the lead frame 17 via a connecting material of the invention, and a translucent resin 19 sealing them. The LED chip 18 is connected to the lead frame 17 by a wire 14.

The semiconductor device of the invention is obtained by using a connecting material of the invention to bond a semiconductor element to a supporting member. After the semiconductor element has been bonded to the supporting member, a wire bond step and sealing step may be carried out if necessary.

Examples of supporting members include lead frames such as 42 alloy lead frames, copper lead frames and palladium PPF lead frames, glass epoxy boards (glass fiber-reinforced epoxy resin boards), BT boards (boards employing BT resins composed of cyanate monomer or an oligomer thereof with bismaleimide), and other organic boards.

For bonding of a semiconductor element to a supporting member such as a lead frame using a connecting material of the invention, first the connecting material is coated onto the supporting member by a dispensing method, screen printing method, stamping method or the like, and the semiconductor element is contact bonded and then heat cured using a heating apparatus such as an oven or heat block. The heat curing is usually carried out by heating at 100-200° C. for 5 seconds to 10 hours. A wire bonding step may then be followed by sealing by a common method to complete the semiconductor device.

EXAMPLES

The present invention will now be further explained in detail by examples, with the understanding that the invention is not limited thereby. The materials used in the examples and reference examples were prepared or obtained as follows.

(1) Epoxy resin solution: 7.5 parts by weight of YDF-170 (trade name of Tohto Kasei Co., Ltd., bisphenol F-type epoxy resin, epoxy equivalents=170) and 7.5 parts by weight of YL-980 (trade name of Yuka-Shell Epoxy Co., Ltd., bisphenol A-type epoxy resin, epoxy equivalents=185) were heated to 80° C., and stirring was continued for 1 hour to obtain a uniform epoxy resin solution.

(2) Curing accelerator: 1.1 parts by weight of 2PZCNS-PW (trade name of Shikoku Chemicals Corp., imidazole).

(3) Volatile components: Dipropyleneglycol methyl ether acetate (hereunder, DMPA) (Dicel Chemical Industries, Ltd.), toluene (Kanto Kagaku Co., Ltd.) and γ-butyrolactone (Sankyo Chemical Co., Ltd.).

(4) Metallic particles: K-0082P (trade name of Metalor, silver powder, mean particle size: 1.6 oxygen state ratio: 4%) and AgF 10S (trade name of Tokuriki Chemical Research Co., Ltd., silver powder, mean particle size: 10 μm, oxygen state ratio: 15%).

Also, surface-treated Ag powder was prepared by oxide film removal and surface treatment of AgF10S, in that order.

An acidic solution was prepared by diluting 28 parts by weight of hydrochloric acid (Kanto Kagaku Co., Ltd.) with 80 parts by weight of ethanol (Kanto Kagaku Co., Ltd.). A surface treatment solution was prepared by adding 0.29 part by weight of stearylmercaptane (Tokyo Kasei Kogyo Co., Ltd.) as a surface protective material to the acidic solution.

AgF10S was added to the surface treatment solution, and subjected to oxide film removal and surface treatment by stirring for 1 hour while maintaining a temperature of 40° C. It was then filtered to remove the surface treatment solution, and 40° C. ethanol was added to wash the surface-treated Ag powder.

The ethanol washing solution was removed by filtration, and the washing and filtration steps were repeated about 10 times to remove the stearylmercaptane and hydrochloric acid physically adsorbed onto the surface-treated Ag powder surface.

After the final washing, the surface-treated Ag powder was dried under reduced pressure to remove the ethanol, to obtain dry surface-treated Ag powder. The oxygen state ratio of the obtained surface-treated Ag powder was 0%, thus confirming that the oxide film had been completely removed.

Materials (1) and (2) were kneaded for 10 minutes with a kneader to obtain a binder component.

Next, materials (3) and (4) were added in the mixing proportions listed in Table 1 and the mixture was kneaded for 15 minutes with a kneader to obtain a connecting material.

The physical properties of the connecting material were examined by the following methods. The compositions of the metallic particles, volatile components and binder components, and the property measurement results, are shown in Table 1 and Table 2.

(1) Shear strength: The connecting material was coated in an amount of 0.2 mg onto a Ag-plated Cu lead frame (land: 10×5 mm), a 2 mm×2 mm Ag-plated Cu chip (0.15 mm thickness) was bonded thereto, and heat treatment was carried out at 180° C. for 1 hour on a hot plate (HHP-401).

This was followed by measurement of the shear strength (MPa) using a universal bond tester (4000 Series by Dage, Ltd.) at a measuring speed of 500 μm/s and a measuring height of 100 μm, after heating at 260° C. for 30 seconds.

(2) Coefficient of thermal conductivity of cured connecting material: The connecting material was heat treated at 180° C. for 1 hour to obtain a 10×10×1 mm test piece. The thermal diffusivity of the test piece was measured by the laser flash method (LFA 447, product of Netzsch, 25° C.), and the coefficient of thermal conductivity (W/m·K) of the cured connecting material at 25° C. was calculated from this thermal diffusivity and the product of the specific heat capacity obtained with a differential scanning calorimeter (Pyris 1 by Perkin-Elmer) and the specific gravity obtained by Archimedes' method.

coefficient of thermal conductivity of 20 W/m·K or greater while maintaining shear strength.

Also, Reference Example 5 shows that a connecting material comprising AgF10S with an oxygen state ratio of 15% or greater and a binder component, exhibited a low coefficient of thermal conductivity of no greater than 2 W/m·K, but the connecting material of Example 5, comprising surface-treated AgF10S and a binder component, exhibited a high coefficient of thermal conductivity of 20 W/m·K or greater while maintaining shear strength.

Incidentally, Examples 6 and 7 show that connecting materials comprising surface-treated AgF5S with an oxygen state ratio of 10%, with a volatile component and a binder component, exhibit higher coefficients of thermal conductivity and shear strengths than connecting materials comprising AgF5S

TABLE 1

| | | | Examples | | | | | | |
|---|---|---|---|---|---|---|---|---|---|
| | | | 1 | 2 | 3 | 4 | 5 | 6 | 7 |
| Composition (oxygen state ratio) | Metal particles | Surface-treated AgF10S (0%) | 92 | 92 | 92 | 92 | 92 | — | — |
| | | Surface-treated AgF5S (10%) | — | — | — | — | — | 92 | 92 |
| | Volatile components | DMM | 8 | — | — | 4 | — | 8 | 4 |
| | | Toluene | — | 8 | — | — | — | — | — |
| | | γ-Butyrolactone | — | — | 8 | — | — | — | — |
| | Binder component | | — | — | — | 4 | 8 | — | 4 |
| Properties | Thermal conductivity (W/m·K) | | 78 | 74 | 84 | 27 | 21 | 75 | 23 |
| | Shear strength (MPa) | | 7.1 | 7.2 | 9.4 | 1.6 | 2.1 | 6.8 | 1.5 |

TABLE 2

| | | | Reference Examples | | | | | | |
|---|---|---|---|---|---|---|---|---|---|
| | | | 1 | 2 | 3 | 4 | 5 | 6 | 7 |
| Composition (oxygen state ratio) | Metal particles | AgF10S (15%) | 92 | 92 | 92 | 92 | 92 | — | — |
| | | AgF5S (20%) | — | — | — | — | — | 92 | 92 |
| | Volatile components | DMM | 8 | — | — | 4 | — | 8 | 4 |
| | | Toluene | — | 8 | — | — | — | — | — |
| | | γ-Butyrolactone | — | — | 8 | — | — | — | — |
| | Binder component | | — | — | — | 4 | 8 | — | 4 |
| Properties | Thermal conductivity (W/m·K) | | 0* | 0* | 0* | 2.6 | 2.0 | 0* | 1.5 |
| | Shear strength (MPa) | | 0 | 0 | 0 | 1.2 | 2.5 | 0 | 1.1 |

*10 × 10 × 1 mm test piece for measurement of thermal conductivity could not be fabricated due to lack of sintering of metal particles.

As shown in Table 1 and Table 2, the connecting materials comprising surface-treated Ag powder and volatile components, for Examples 1-3, clearly exhibited high coefficients of thermal conductivity of 70 W/m·K or greater, and high shear strengths of 7 MPa or greater at 260° C. In contrast, Reference Examples 1-3 clearly show that connecting materials comprising Ag powder with an oxygen state ratio of 15% or greater (AgF10S) and a volatile component, did not produce sintering between the metallic particles at 180° C., and thus did not allow fabrication of test pieces for measurement of the coefficient of thermal conductivity, and shear strength was also not exhibited.

Also, Reference Example 4 shows that a connecting material comprising Ag powder with an oxygen state ratio of 15% or greater (AgF10S), a volatile component and a binder component, exhibited a low coefficient of thermal conductivity of no greater than 3 W/m·K, but the connecting material of Example 4, comprising surface-treated Ag powder with a volatile component and binder component, exhibited a high with an oxygen state ratio of 20% or greater, with a volatile component and a binder component, as in Reference Examples 6 and 7.

Examples 8-14 and Reference Examples 8-11

The following binders (A), fillers (B) and additives (C) were prepared.

Binder (A):

The binder (A) is prepared by using a kneader for 10 minutes of kneading 37.6 parts by weight of an epoxy resin solution (A1), 9.2 parts by weight of an acrylonitrile-butadiene copolymer (A2), 18.4 parts by weight of an epoxidated polybutadiene (A3), 1.8 parts by weight of an epoxy resin curing agent (A4), 0.8 part by weight of a curing accelerator (A5), 18.2 parts by weight of a diluent (A6), 14.7 parts by weight of a methacrylic acid ester compound (A7) and 0.5 part by weight of a radical initiator (A8).

Epoxy resin solution (A1): After heating 7.5 parts by weight of YDF-170 (trade name of Tohto Kasei Co., Ltd., bisphenol F-type epoxy resin, epoxy equivalents=170) and 7.5 parts by weight of YL-980 (trade name of Japan Epoxy Resins Co., Ltd., bisphenol A-type epoxy resin, epoxy equivalents=185) to 80° C., stirring was continued for 1 hour to obtain a uniform epoxy resin solution.

Acrylonitrile-butadiene copolymer (A2):
CTBNX-1300×9 (trade name of Ube Industries, Ltd., carboxyl-terminated acrylonitrile-butadiene copolymer)
Epoxidated polybutadiene (A3):
E-1000-8.0 (trade name of Nippon Petrochemicals Co., Ltd.)
Epoxy resin curing agent (A4):
Dicyandiamide
Curing accelerator (A5):
C17Z (trade name of Shikoku Chemicals Corp., imidazole)
Diluent (A6):
PP-101 (trade name of Tohto Kasei Co., Ltd., alkylphenyl glycidyl ether)
Methacrylic acid ester compound (A7):
Ethyleneglycol dimethacrylate
Radical initiator (A8):
Dicumyl peroxide
Filler (B):
AgC-224 (trade name of Fukuda Metal Foil & Powder Co., Ltd., silver powder, mean particle size: 10 μm)
SPQ05J (trade name of Mitsui Mining & Smelting Co., Ltd., silver powder, mean particle size: 0.85 μm)
SA1507 (trade name of Metalor, silver powder, mean particle size: 15 μm)
Additive (C):
Dipropyleneglycol methyl ether
Toluene
Propyleneglycol methyl ether acetate
Dodecanethiol (1) Viscosity: An EHD-type rotating viscosimeter (Tokyo Keiki Kogyo Co., Ltd.) was used for measurement of the 0.5 rpm viscosity (Pa·s) of the connecting material at 25° C.

(2) Die shear strength (shear strength): The connecting material was coated onto a palladium-plated lead frame (PPF, land: 10×8 mm) in an amount of about 0.2 mg, and then a 2 mm×2 mm silicon chip (0.4 mm thickness) was contact bonded onto it and heat treated at 180° C. for 1 hour with a clean oven (Espec Corp.). This was subjected to measurement of the shear strength (MPa) using a universal bond tester (4000 Series by Dage, Ltd.) at a measuring speed of 500 μm/s and a measuring height of 120 μm, after heating at 260° C. for 30 seconds.

(3) Coefficient of thermal conductivity of compact of mixture of filler (B) and additive (C): The filler (B) and additive (C) were mixed in the mixing proportions shown in Table 3, and kneaded with a mortar or the like, to a total weight of 20 g. The resulting powder-like or paste-like mixture was molded to 10×10×1 mm, and heat treated at 180° C. for 1 hour. The thermal diffusivity of the molded article was measured by the laser flash method (LFA 447, product of Netzsch, 25° C.), and the coefficient of thermal conductivity (W/m·K) of the cured mixture compact of the filler (B) and additive (C) at 25° C. was calculated from this thermal diffusivity and the product of the specific heat capacity obtained with a differential scanning calorimeter (Pyris 1 by Perkin-Elmer) and the specific gravity obtained by Archimedes' method.

(4) Coefficient of thermal conductivity of cured connecting material: The connecting material was heat treated at 180° C. for 1 hour to obtain a 10×10×1 mm test piece. The thermal diffusivity of the test piece was measured by the laser flash method (LFA 447, product of Netzsch, 25° C.), and the coefficient of thermal conductivity (W/m·K) of the cured connecting material at 25° C. was calculated from this thermal diffusivity and the product of the specific heat capacity obtained with a differential scanning calorimeter (Pyris1 by Perkin-Elmer) and the specific gravity obtained by Archimedes' method.

TABLE 3

| | | | Examples | | | | | | | Reference Examples | | | |
|---|---|---|---|---|---|---|---|---|---|---|---|---|---|
| | | | 8 | 9 | 10 | 11 | 12 | 13 | 14 | 8 | 9 | 10 | 11 |
| Composition | Binder (A) | | 6 | 6 | 4 | 6 | 6 | 6 | 6 | 15 | 7 | 6 | 4 |
| | Fillers | AgC-224 | 94 | 94 | 96 | 94 | 94 | 94 | — | 85 | 93 | — | — |
| | | SPQ05J | — | — | — | — | — | — | 94 | — | — | — | — |
| | | SA1507 | — | — | — | — | — | — | — | — | — | 94 | 96 |
| | Additives | Dipropyleneglycol methyl ether | 4 | 1 | 4 | — | — | — | 4 | — | — | 4 | 4 |
| | | Toluene | — | — | — | 4 | — | — | — | — | — | — | — |
| | | Propyleneglycol methyl ether acetate | — | — | — | — | 4 | — | — | — | — | — | — |
| | | Dodecanethiol | — | — | — | — | — | 1 | — | — | — | — | — |
| Properties | Thermal conductivity (filler + additive compact) (W/mK) | | 60 | 48 | 49 | 55 | 50 | 45 | 59 | 8 | 8 | 21 | 15 |
| | Viscosity (Pa · s) | | 86 | 140 | 156 | 123 | 115 | 128 | 140 | 92 | 730 | 85 | 335 |
| | Die shear strength (MPa) | | 7.7 | 8.5 | 6.2 | 6.0 | 8.1 | 6.5 | 7.9 | 8.7 | 2.1 | 8.5 | 5.6 |
| | Thermal conductivity (connecting material) (W/mK) | | 32 | 23 | 35 | 28 | 25 | 21 | 33 | 1 | 20 | 12 | 25 |

The prepared binder (A), filler (B) and additive (C) were combined in the mixing proportions shown in Table 3 and kneaded with a kneader for 15 minutes, and then kneaded at no greater than 5 Torr, to obtain connecting materials for Examples 8-14 and Reference Examples 8-11

The physical properties of the connecting materials of Examples 8-14 and Reference Examples 8-11, and the physical properties of compacts of mixtures of the filler (B) and additive (C), were measured by the following methods. The results are shown in Table 3.

With the connecting materials of Examples 8-14, it is possible to obtain excellent viscosity for manageability, and to improve the coefficient of thermal conductivity while maintaining bonding strength. The connecting material of Reference Example 8, which contained no additives, had a low coefficient of thermal conductivity of the compact of the mixture of the filler (B) and additive (C), and the coefficient of thermal conductivity of the cured connecting material was also low. The connecting material of Reference Example 9, which contained no additives, had a relatively high coefficient of thermal conductivity of the cured connecting material and the content ratio of filler (B) was high, and therefore the viscosity of the connecting material was high. The connecting material of Reference Example 10, which contained additives, had a low coefficient of thermal conductivity of the compact of the mixture of the filler (B) and additive (C), and therefore the coefficient of thermal conductivity of the cured connecting material was low. The connecting material of Reference Example 11, which contained additives, had a high coefficient of thermal conductivity of the cured connecting material, and therefore the coefficient of thermal conductivity of the compact of the mixture of the filler (B) and additive (C) was low and the viscosity of the connecting material was high.

REFERENCE SIGNS LIST 1,4: Surface protective material, 2: oxide film, 3: bulk metal, 11: chip, 12a, 12b, 12c: lead frame, 14: wire, 15: mold resin, 16: board, 17: lead frame, 18: chip, 19: translucent resin.

The invention claimed is:

1. A connecting material comprising metallic particles having an oxygen state ratio of less than 15% as measured by X-ray photoelectron spectroscopy, and wherein the mean particle size of the metallic particles is between 0.1 μm and 50 μm.

2. The connecting material according to claim 1, wherein the metallic particles are metallic particles that have been subjected to treatment for removal of the oxide film on the surface and to surface treatment with a surface protective material.

3. The connecting material according to claim 1, wherein the metallic particles are metallic particles sintered at no higher than 200° C.

4. The connecting material according to claim 1, which further comprises a volatile component or a binder component.

5. A semiconductor device having a structure wherein a semiconductor element and a semiconductor element-mounting supporting member are bonded using a connecting material according to claim 1.

6. A semiconductor device having a structure wherein a semiconductor element and a semiconductor element-mounting supporting member are bonded using a connecting material according to claim 2.

7. A semiconductor device having a structure wherein a semiconductor element and a semiconductor element-mounting supporting member are bonded using a connecting material according to claim 4.

8. The connecting material according to claim 2, wherein the surface protective material is at least one compound having a terminal functional group selected from the group consisting of hydroxyl, carboxyl, amino, thiol and disulfide.

9. The connecting material according to claim 2, wherein the surface protective material is at least one compound having a thiol terminal functional group.

10. The connecting material according to claim 2, wherein the surface protective material is at least one compound having a straight-chain alkane backbone having 1-18 carbon atoms and having a terminal functional group selected from the group consisting of hydroxyl, carboxyl, amino, thiol and disulfide.

11. The connecting material according to claim 2, wherein said mean particle size is between 1.6 μm and 50 μm.

12. The connecting material according to claim 1, wherein said mean particle size is between 1.6 μm and 50 μm.

* * * * *